(12) United States Patent
Choi et al.

(10) Patent No.: US 9,991,858 B2
(45) Date of Patent: Jun. 5, 2018

(54) RECEIVER RESILIENT TO NOISE INPUT

(71) Applicants: SK hynix Inc., Icheon (KR); Seoul National University R&DB FOUNDATION, Seoul (KR)

(72) Inventors: Sungphil Choi, Seoul (KR); Mino Kim, Seoul (KR); Suhwan Kim, Seoul (KR); Deog-Kyoon Jeong, Seoul (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days. days.

(21) Appl. No.: 15/584,885

(22) Filed: May 2, 2017

(65) Prior Publication Data
US 2018/0062594 A1   Mar. 1, 2018

(30) Foreign Application Priority Data
Aug. 30, 2016   (KR) ........................ 10-2016-0110461

(51) Int. Cl.
*H03K 17/16* (2006.01)
*H03F 3/45* (2006.01)

(52) U.S. Cl.
CPC ......... *H03F 3/45977* (2013.01); *H03K 17/16* (2013.01); *H03F 2200/372* (2013.01)

(58) Field of Classification Search
CPC .......... H03F 3/45977; H03F 2200/372; H03K 17/16
USPC ........................................... 326/22
See application file for complete search history.

(56) References Cited

U.S. PATENT DOCUMENTS

| | | | |
|---|---|---|---|
| 4,641,105 A | 2/1987 | Albaugh et al. | |
| 6,262,626 B1 * | 7/2001 | Bakker | H03F 1/303 330/9 |
| 7,542,508 B2 * | 6/2009 | Marlett | H04L 25/03057 375/233 |
| 8,035,438 B2 | 10/2011 | Esch, Jr. | |
| 2004/0121735 A1 * | 6/2004 | Tseng | H03F 3/45973 455/75 |

* cited by examiner

*Primary Examiner* — Daniel D Chang

(57) ABSTRACT

A receiver includes a signal receiving part suitable for outputting a signal corresponding to a reception signal that is received through an input terminal, and controlling a DC voltage of a signal to be outputted, according to an offset signal, an amplifying part suitable for amplifying and outputting an output of the signal receiving part, and a feedback control part suitable for controlling the offset signal according to an output of the amplifying part.

16 Claims, 9 Drawing Sheets

FIG. 1 <PRIOR ART>

| S | R | Q | QB | |
|---|---|---|---|---|
| 0 | 0 | 1 | 0 | +OFFSET |
| 0 | 1 | 0 | 1 | -OFFSET |
| 1 | 0 | 1 | 0 | +OFFSET |
| 1 | 1 | X | X | X |

FIG. 5

| S | R | Q | QB |  |
|---|---|---|----|---|
|   |   | Q | QB | NO CHANGE |
| 0 | 1 | 0 | 1  | - OFFSET |
| 0 | 0 | 1 | 0  | + OFFSET |
| 1 | 1 | X | X  | X |

FIG. 7

RECEIVER RESILIENT TO NOISE INPUT

CROSS-REFERENCE TO RELATED APPLICATIONS

The present application claims priority of Korean Patent Application No. 10-2016-0110461, filed on Aug. 30, 2016, which is incorporated herein by reference in its entirety.

BACKGROUND

1. Field

Exemplary embodiments of the present disclosure relate to a receiver, and more particularly, to a receiver which reduces the possibility of a malfunction occurring due to noise applied to an input terminal of the receiver.

2. Description of the Related Art

FIG. 1 shows a conventional receiver 10. The conventional receiver 10 receives receiving signals RXI and RXIB transmitted through first and second channels 1-1 and 1-2, respectively, and generates output signals OUT and OUTB. Signals inputted to the first and second channels 1-1 and 1-2 are referred to as channel signals CHI and CHIB, respectively.

FIG. 2 is a waveform diagram which shows drawbacks of the receiver 10 in FIG. 1.

When the channel signals CHI and CHIB are applied to the first and second channels 1-1 and 1-2, respectively, the receiving signals RXI and RXIB, which have passed through the first and second channels 1-1 and 1-2, respectively, are applied to the receiver 10.

In a time period in which the channel signals CHI and CHIB are not applied to the channels 1-1 and 1-2, a noise may be applied to input terminals of the receiver 10. The term "noise", as used herein, may refer to a noise component of a current or voltage signal. In this case, signals at the input terminals of the receiver 10 cannot maintain desired uniform levels because of the noise.

When similar noises are applied to the two input terminals of the receiver 10, a difference between the signals at the input terminals may be substantially zero. Accordingly, a malfunction due to the noises does not occur in the receiver 10.

However, when different noises are applied to the two input terminals of the receiver 10 because of a difference of characteristics of the first and second channels 1-1 and 1-2, the receiver 10 may amplify the different noises, and may output the amplified signals as the output signals OUT and OUTB in pulse forms.

In the time period in which the channel signals CHI and CHIB are not applied to the channels 1-1 and 1-2, the output signals OUT and OUTB may not have uniform levels because of noises, and may have unpredictable values.

Accordingly, the conventional receiver 10 may cause a malfunction in a system that uses the output signals of the conventional receiver 10.

SUMMARY

Various embodiments of the present disclosure are directed to a receiver which can prevent a noise from affecting an output signal thereof, the noise being applied to an input terminal of the receiver.

A receiver according to an embodiment may include: a signal receiving part suitable for outputting a signal corresponding to a receiving signal that is received to an input terminal, and controlling a DC voltage of a signal outputted in accordance with an offset signal; an amplifying part suitable for amplifying and outputting an output of the signal receiving part; and a feedback control part suitable for controlling an offset signal in accordance with the output of the amplifying part.

A receiver according to an embodiment may substantially prevent the output of any noise by a noise applied to an input terminal of the receiver when a normal signal is not inputted to the receiver.

BRIEF DESCRIPTION OF THE DRAWINGS

FIG. 5 is a truth table showing an operation of a feedback control part in FIG. 3 in accordance with an embodiment.

FIG. 7 is a truth table showing an operation of the feedback control part in FIG. 3 in accordance with another embodiment.

DETAILED DESCRIPTION

Figure 1:
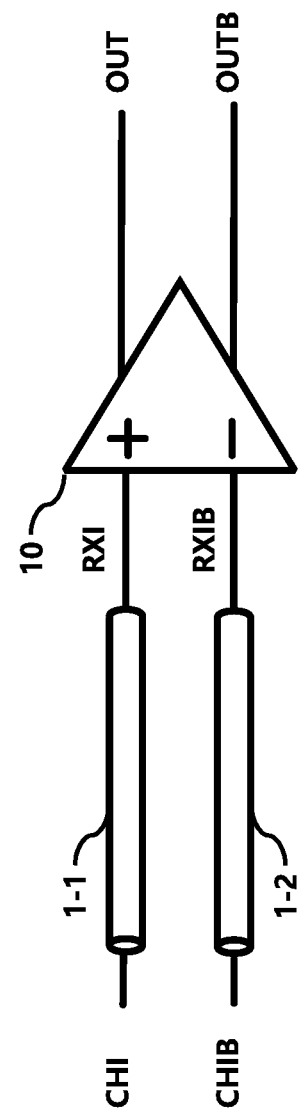
FIG. 1 is a block diagram of a conventional receiver.
Figure 2:
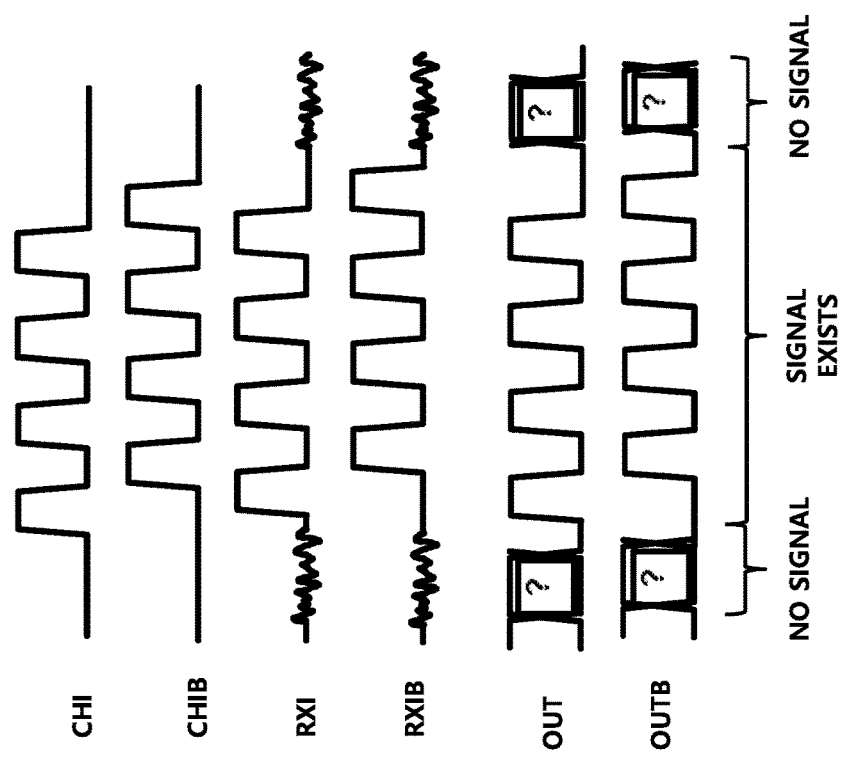
FIG. 2 is a waveform diagram showing drawbacks of FIG. 1.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present disclosure.

Hereinafter, embodiments will be described with reference to the accompanying drawings.

Figure 3:
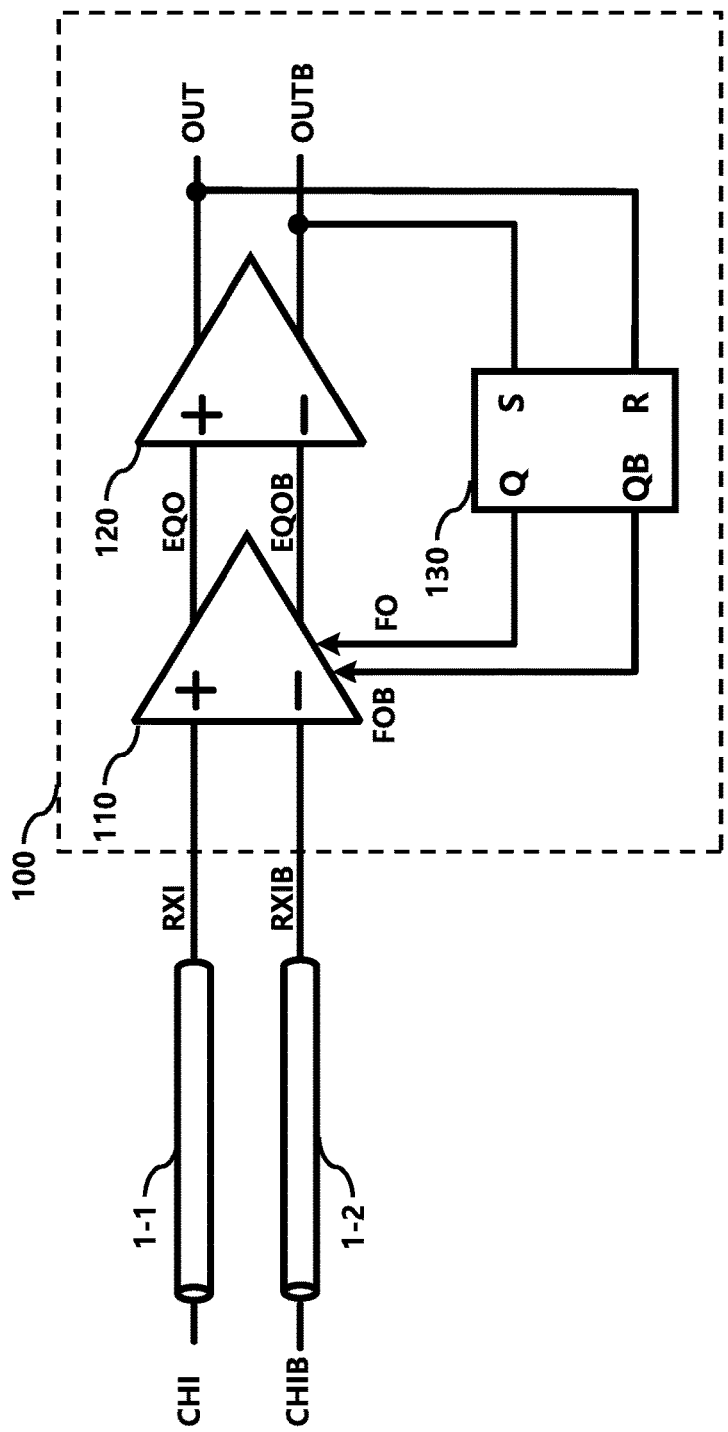
FIG. 3 is a block diagram of a receiver in accordance with an embodiment.

FIG. 3 is a block diagram of a receiver 100 according to an embodiment.

The receiver 100 generates a differential signal, which includes output signals OUT and OUTB, based on a differential signal, which includes receiving signals RXI and RXIB.

The receiving signal RXI may be described as a first receiving signal, and the receiving signal RXIB may be described as a second receiving signal.

The output signal OUT may be described as a first output signal, and the output signal OUTB may be described as a second output signal.

The first and second receiving signals RXI and RXIB are signals obtained by passing channel input signals CHI and CHIB through first and second channels 1-1 and 1-2, respectively.

The receiver 100 includes a signal receiving part 110, an amplifying part 120, and a feedback control part 130.

The signal receiving part 110 outputs a differential signal including signals EQO and EQOB based on the first and second receiving signals RXI and RXIB.

In the present embodiment, the signal receiving part 110 controls DC voltages of the signals EQO and EQOB in response to a differential signal, which includes offset signals FO and FOB that are provided by the feedback control part 130.

The offset signal FO may be described as a first offset signal, and the offset signal FOB may be described as a second offset signal.

When EYE characteristics of the first and second receiving signals RXI and RXIB inputted to the signal receiving part 110 are not good, the signal receiving part 110 may further perform an equalization operation.

The equalization operation is well-known to people having ordinary skill in the art, and its description is therefore omitted.

In accordance with an embodiment, the signal receiving part 110 outputs the equalization signals EQO and EQOB, which are equalized signals of the first and second receiving signals RXI and RXIB, and the DC voltages of the equalization signals EQO and EQOB are controlled by the first and second offset signals FO and FOB.

The equalization signal EQO may be described as a first equalization signal, and the equalization signal EQOB may be described as a second equalization signal.

The amplifying part 120 amplifies a difference between the first and second equalization signals EQO and EQOB, and outputs the first and second output signals OUT and OUTB.

The first and second output signals OUT and OUTB may be digital signals.

For example, the amplifying part 120 may output a digital signal "1" when the difference (EQO-EQOB) is positive, and may output a digital signal "0" when the difference (EQO-EQOB) is negative or zero.

The feedback control part 130 outputs the first and second offset signals FO and FOB based on the first and second output signals OUT and OUTB of the amplifying part 120.

In the present embodiment, the DC voltage of the first equalization signal EQO and the DC voltage of the second equalization signal EQOB are controlled differently in response to the first and second offset signals FO and FOB.

Accordingly, in a time period in which a meaningful signal is not applied to input terminals of the signal receiving part 110, if a difference between signals at the input terminals of the signal receiving part 110 does not have a uniform value and changes unpredictably with respect to a ground level because of noises applied to the input terminals, the DC voltages of the first and second equalization signals EQO and EQOB may have different values from each other.

Accordingly, the difference between the first and second equalization signals EQO and EQOB (EQO-EQOB) inputted to the amplifying part 120 is fixed as being positive or negative, and therefore the first and second output signals OUT and OUTB have uniform values in the time period in which no meaningful signal is applied to the signal receiving part 110.

When the first and second offset signals FO and FOB maintain uniform values, if normal signals are inputted to the signal receiving part 110, a duty ratio of the first and second output signals OUT and OUTB does not have a desired value (for example, 50%), but may have a value more than or less than 50%.

To solve this problem, the feedback control part 130 controls the first and second offset signals FO and FOB in response to the first and second output signals OUT and OUTB, thereby preventing the distortion of the duty ratio of the first and second output signals OUT and OUTB.

Figure 4:
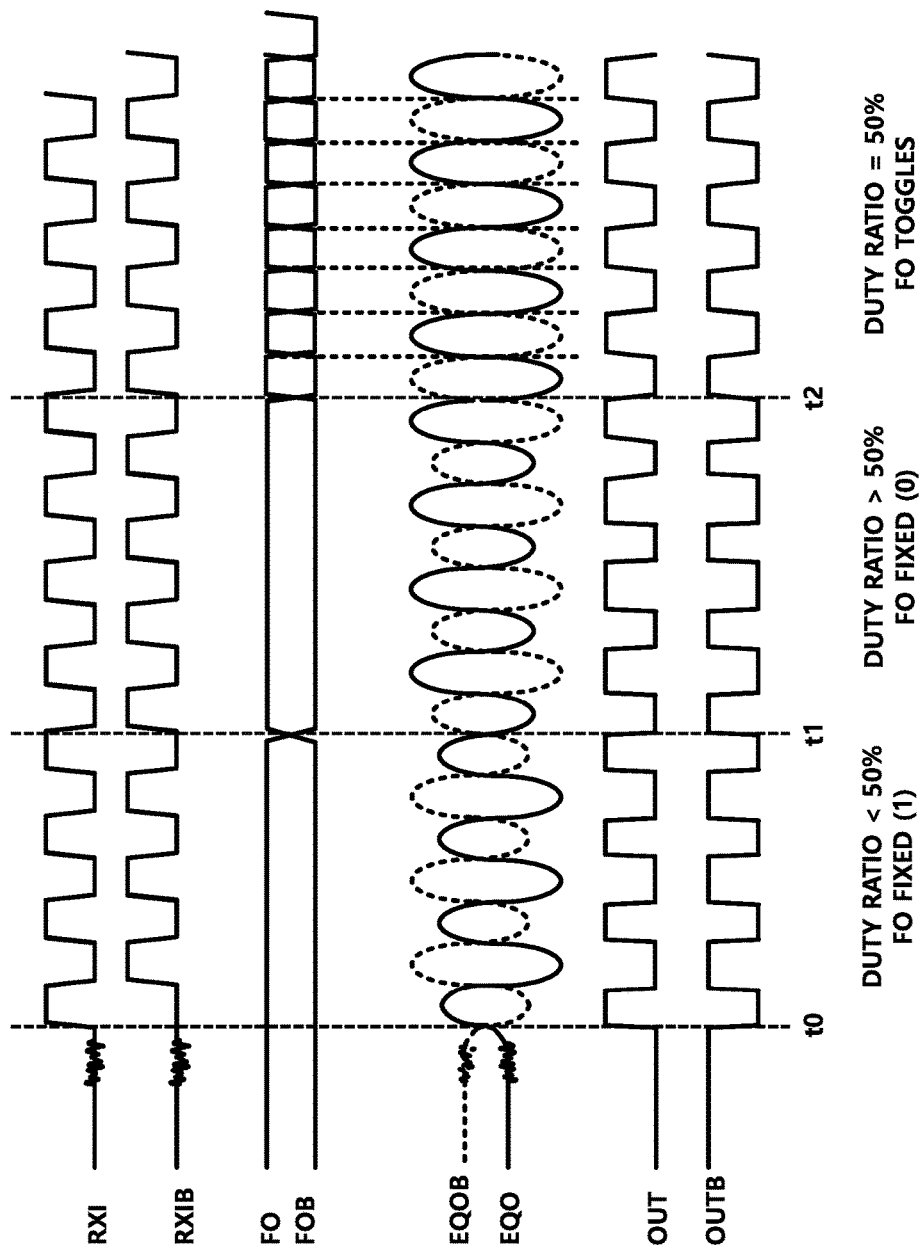
FIG. 4 is a waveform diagram showing an operation of the receiver in FIG. 3 in accordance with an embodiment.

FIG. 4 is a wave diagram showing an operation of the receiver 100 in FIG. 3 in accordance with an embodiment.

Referring to FIG. 4, a meaningful signal is not applied to the signal receiving part 110 in a time period before a time t0, and meaningful signals, e.g., the first and second receiving signals RXI and RXIB, are applied to the signal receiving part 110 in a time period after the time t0.

The first offset signal FO is set to "1" until a time t1, the first offset signal FO is set to "0" during a time period between the time t1 to a time t2, and then the first offset signal FO toggles in accordance with the first output signal OUT after the time t2.

If the first offset signal FO is set to "1", the DC voltage of the second equalization signal EQOB, outputted from the signal receiving part 110, increases. If the first offset signal FO is set to "0", the DC voltage of the first equalization signal EQO increases.

If the normal signals are not applied to the signal receiving part 110 before the time t0, the first offset signal FO is set to "1", and the DC voltage of the second equalization signal EQOB increases.

Accordingly, although noises are applied to the input terminals of the signal receiving part 110, the first and second equalization signals EQO and EQOB may not cross, and thus the difference of the first and second equalization signals EQO and EQOB (EQO-EQOB) may be maintained to be negative.

Therefore, referring to FIG. 4, before the time t0, the first output signal OUT of the amplifying part 120 is constantly maintained as "0".

This means that noises applied to the receiver 100 do not cause malfunction in the output signal OUT.

After the time t0, the receiving signals RXI and RXIB are applied to the signal receiving part 110.

In the present embodiment, it is assumed that the duty ratio of the receiving signals RXI and RXIB is 50% and that the receiving signals RXI and RXIB are toggling clock signals.

From the time t0 to the time t1, the offset signal FO is maintained as "1".

As described above, when the offset signal FO is set to "1", the DC voltage of the equalization signal EQOB increases.

Referring to FIG. 4, it is described that the DC voltages of the equalization signals EQO and EQOB change in accordance with the offset signals FO and FOB.

When one of the DC voltages of the equalization signals EQO and EQOB changes, a time, at which the difference of the equalization signals EQO and EQOB (EQO-EQOB) changes sign from positive to negative or vice versa, is changed. Accordingly, the duty ratio of the output signals OUT and OUTB of the amplifying part 120 is also changed.

From the time t0 to the time t1, the DC voltage of the equalization signal EQOB increases because the offset signal FO is set to "1". Therefore, a time period, in which the difference of the equalization signals EQO and EQOB (EQO-EQOB) is positive, becomes narrower as the DC voltage of the equalization signal EQOB increases, and thus the duty ratio of the output signals OUT and OUTB becomes less than 50%.

On the other hand, from the time t1 to the time t2, the offset signal FO is set to "0".

When the offset signal FO is set to "0", the DC voltage of the equalization signal EQO increases.

Therefore, in FIG. 4, from the time t1 to the time t2, the DC voltage of the equalization signal EQO increases. Accordingly, the time period in which the difference of the equalization signals EQO and EQOB (EQO-EQOB) is positive becomes wider than the time period from the time t0 to the time t1, because the DC voltage of the equalization signal EQO increases, and thus the duty ratio of the output signals OUT and OUTB exceeds 50%.

After the time t2, the offset signal FO toggles in accordance with the output signal OUT.

Therefore, the offset signal FO is set to "0" when the output signal OUT is "1", and the offset signal FO is set to "1" when the output signal OUT is "0".

As described above, the duty ratio exceeds 50% when the offset signal FO is set to "0", and the duty ratio becomes less than 50% when the offset signal FO is set to "1". The duty ratio increases or decreases when the output signal OUT toggles, such that the duty ratio of the output signal OUT finally converges on 50%.

To obtain a desirable duty ratio of the output signal OUT, an amount of changes in the DC voltage of the equalization signal EQO needs to be controlled in accordance with the offset signal FO. The amount of changes in the DC voltage can be determined in advance by using a simulation or by using an experiment.

Therefore, in the present embodiment, the offset signal FO is uniformly maintained even though no signal is applied to the receiver 100 before the time t0. The present embodiment prevents noises from being outputted to the output signals OUT and OUTB. When the receiving signals RXI and RXIB are inputted to the receiver 100, the offset signal FO toggles in accordance with the output signal OUT. Therefore, the duty ratio of the output signals OUT and OUTB finally converges on 50% without distortion.

FIG. 5 is a truth table showing an operation of the feedback control part 130 in FIG. 3 in accordance with an embodiment.

The second output signal OUTB of the amplifying part 120 is applied to a set terminal S of the feedback control part 130, and the first output signal OUT of the amplifying part 120 is applied to a reset terminal R of the feedback control part 130.

The first offset signal FO is outputted at an output terminal Q of the feedback control part 130. The second offset signal FOB is outputted at an output terminal QB of the feedback control part 130.

In FIG. 5, a positive offset value (+OFFSET) means that the first offset signal FO is set to "1", and a negative offset value (−OFFSET) means that the first offset signal FO is set to "0".

In an embodiment, the first output signal OUT of the amplifying part 120 is normally maintained as "0" when the first input signal RXI is not applied to the receiver 100.

The second output signal OUTB has an opposite level to the first output signal OUT. Accordingly, there is no embodiment in which "1" is applied to both of the set terminal S and the reset terminal R.

In FIG. 4, at the beginning of the operation of the receiver 100, both of the first and second output signals OUT and OUTB can be "0" temporarily. When "0" is applied to both of the set terminal S and the reset terminal R, the first offset signal FO becomes "1".

After that, when the first and second output signals OUT and OUTB change, the feedback control part 130 outputs "0" as the first offset signal FO when the output signal OUT is "1", and the feedback control part 130 outputs "1" as an offset signal FOB when an output signal OUTB is "0". The feedback control part 130 outputs "1" as the first offset signal FO when the output signal OUT is "0", and the feedback control part 130 outputs "0" as an offset signal FOB when an output signal OUTB is "1".

A digital circuit that operates according to the truth table in FIG. 5 can be easily designed by a person having ordinary skill in the art, and therefore a detailed configuration thereof is omitted.

Figure 6:
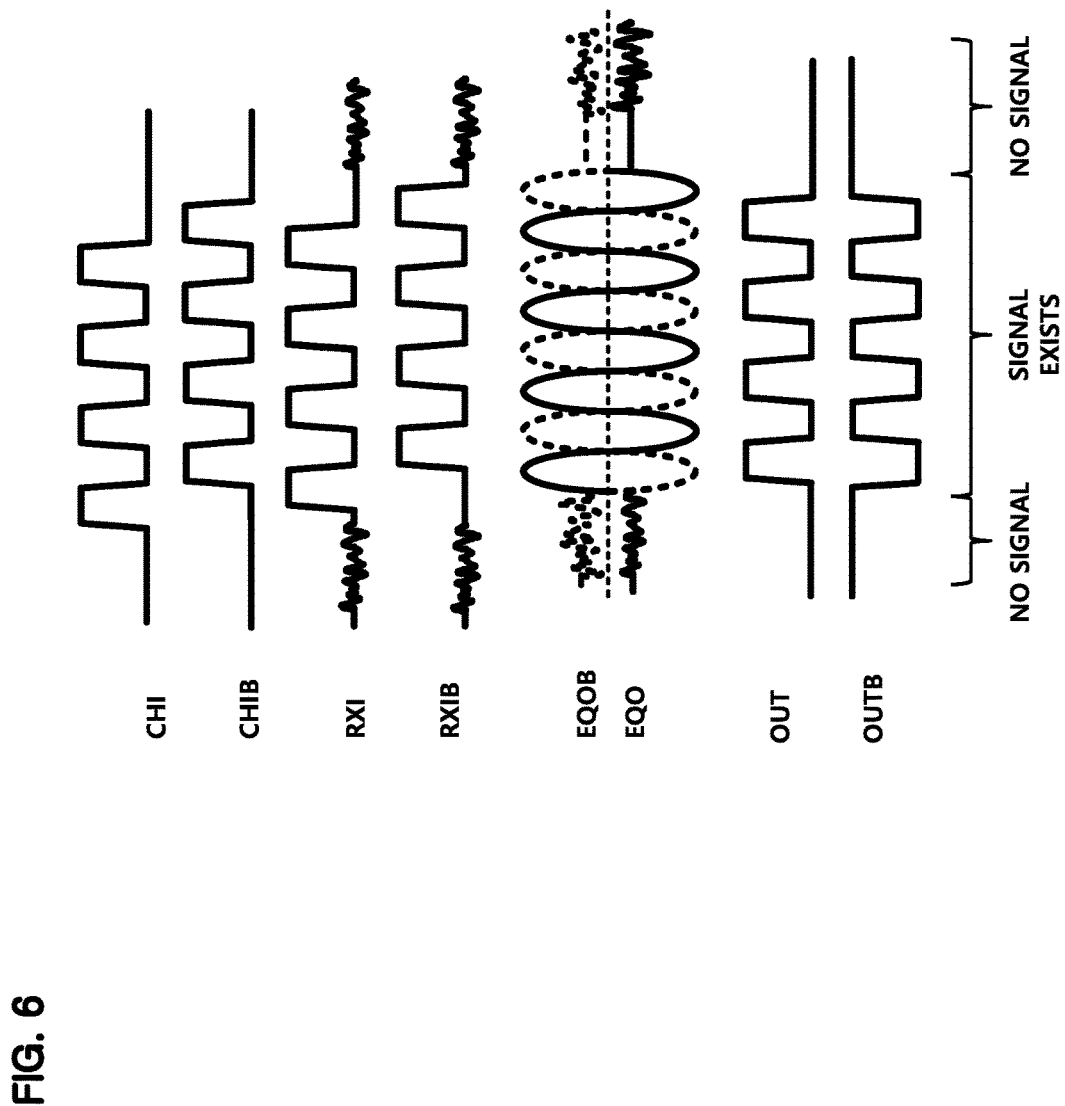
FIG. 6 is a waveform diagram showing an operation of the receiver in FIG. 3 according to the truth table of FIG. 5.

FIG. 6 is a waveform diagram showing an operation of the receiver 100, including the feedback control part 130 in FIG. 3, according to the truth table of FIG. 5.

As described above, both of the output signals OUT and OUTB may correspond to "0" in a beginning stage when a power is on.

Referring to FIG. 5, when the output signal OUT is "0", i.e., "0" is applied to the reset terminal R of the feedback control part 130, the offset signal FO is always maintained as "1".

Since the offset signal FO is maintained as "1" in a time period, in which no signal is input to the receiver 100, including an initialization period of the receiver 100, the DC voltage of the equalization signal EQOB increases, whereas the DC voltage of the equalization signal EQO does not increase.

Accordingly, the output signals OUT and OUTB of the amplifying part 120 are not affected by noises, and thus can maintain uniform levels.

In a time period in which the receiving signals RXI and RXIB are inputted to the receiver 100, the offset signals FO and FOB toggle in accordance with the output signal OUT as previously described, and therefore the duty ratio of the output signals OUT and OUTB is not distorted.

FIG. 7 is a truth table showing an operation of the feedback control part 130 in FIG. 3 in accordance with another embodiment.

In FIG. 7, the feedback control part 130 operates like a general SR latch.

When both of a set signal and a reset signal are "0", the feedback control part 130 maintains its previous output value.

In the present embodiment, an initial value of the feedback control part 130 may not be determined in a beginning stage of the operation of the receiver 100, and thus an initial value of the offset signal FO may not be determined in the beginning stage.

In the present embodiment, the initial values of the offset signals FO and FOB can be determined by receiving initialization signals in the beginning stage of the operation of the receiver 100.

Figure 8:
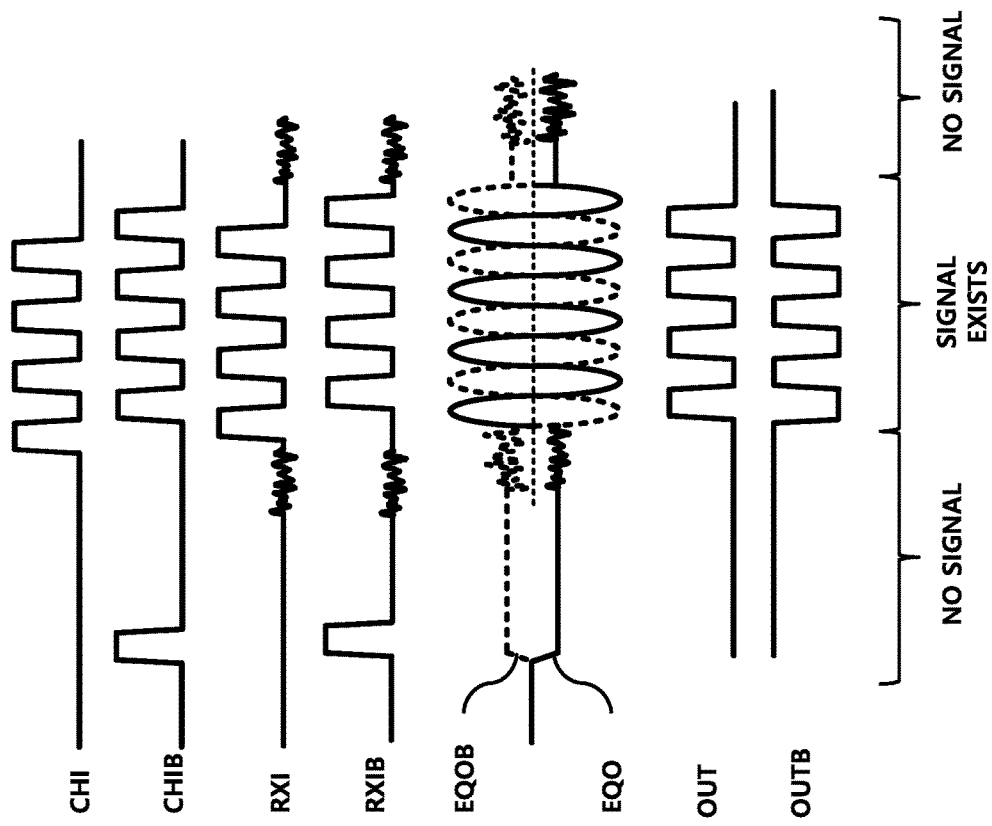
FIG. 8 is a waveform diagram showing an operation of the receiver in FIG. 3 according to the truth table of FIG. 7.

FIG. 8 is a waveform diagram showing an operation of the receiver 100 in FIG. 3 according to the truth table of FIG. 7.

In a time period in which no signal is input to the receiver 100 shown in the left side of FIG. 8, initialization signals having pulse forms are applied to the receiver 100. In this time period, "0" is applied as a channel input signal CHI, and "1" is applied as a channel input signal CHIB.

The initialization signals are transmitted through the channels 1-1 and 1-2, and provided to the signal receiving part 110 as the receiving signals RXI and RXIB.

Before the initialization signals are applied, the equalization signals EQO and EQOB, which are outputted from the signal receiving part 110, can be initialized to correspond to VDD/2.

When the initialization signals pass through the signal receiving part 110 and the amplifying part 120, the output signal OUT may correspond to "0", and the output signal OUTB may correspond to "1". Accordingly, the feedback control part 130 outputs the offset signal FO corresponding to "1".

As the offset signal FO corresponds to "1", the DC voltage of the equalization signal EQOB increases, the output signal OUT of the amplifying part 120 is maintained as "0", and the output signal OUTB is maintained as "1".

As a result, the offset signal FO, which is outputted from the feedback control part 130, is maintained as "1".

Afterwards, in a stage when a normal signal is not applied to the receiver 100, the difference of the equalization signals EQO and EQOB (EQO-EQOB) is maintained as a negative difference, and the output signals OUT and OUTB are constantly maintained, even though noises are applied to the receiver 100.

In a time period in which normal signals are applied to the receiver 100, the offset signals FO and FOB toggle in accordance with the output signals OUT and OUTB, and the distortion of the duty ratio of the output signals OUT and OUTB is prevented, as described above.

Figure 9:
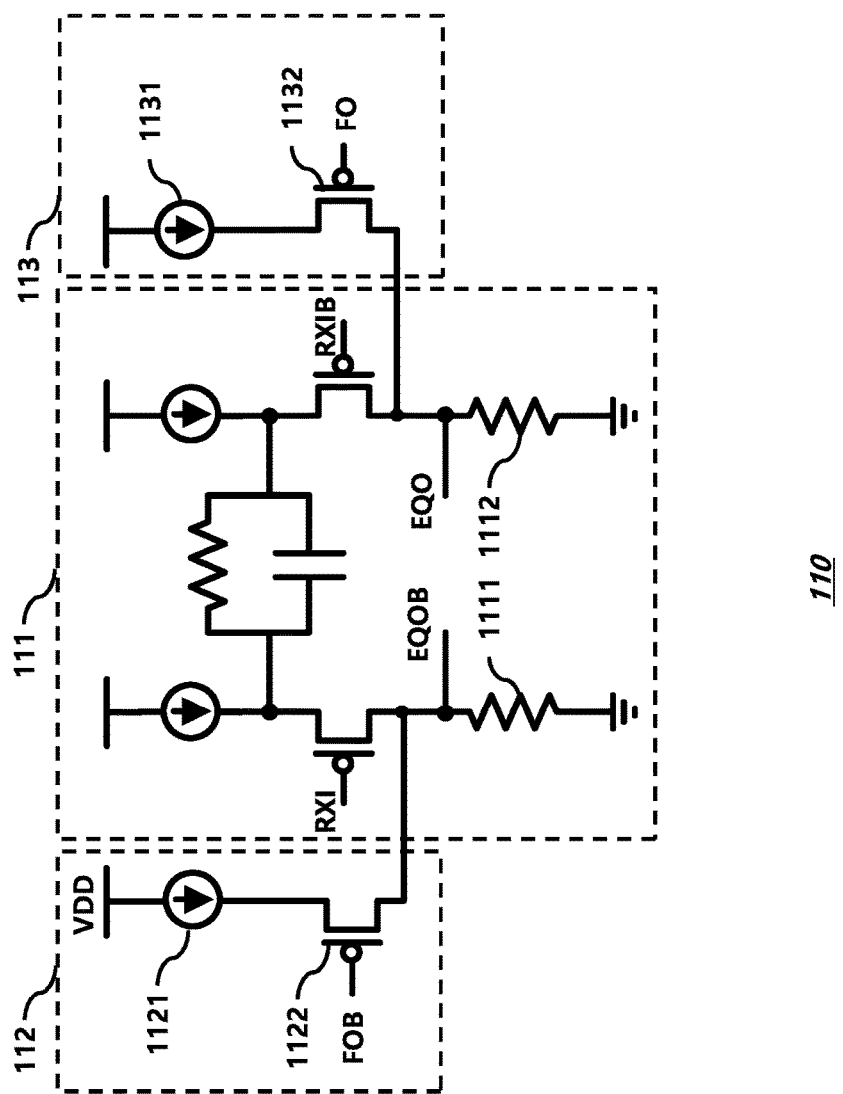
FIG. 9 is a circuit diagram of a signal receiving part in FIG. 3 in accordance with an embodiment.

FIG. 9 is a circuit diagram showing the signal receiving part 110 of FIG. 3 in accordance with an embodiment.

The signal receiving part 110 includes an equalization part 111, a first offset control part 112, and a second offset control part 113. The first and second offset control part 112 and 113 are coupled to output terminals of the equalization part 111, respectively. The equalization signals EQOB and EQO are output through the output terminals of the equalization part 111.

The equalization part 111 equalizes the input signals RXI and RXIB and outputs the equalization signals EQO and EQOB through the output terminals. The first offset control part 112 controls a DC voltage of the equalization signal EQOB in accordance with the offset signal FOB, and the second offset control part 113 controls a DC voltage of the equalization signal EQO in accordance with the offset signal FO.

The equalization part 111 includes a continuous time linear equalizer (CTLE). Since a structure and an operation of the CTLE are well-known to people having ordinary skill in the art, the detailed description thereof is omitted.

The first offset control part 112 includes a current source 1121 and a switch 1122 that are coupled in series between a power supply terminal VDD and the first output terminal of the equalization part 111. The equalization signal EQOB is output through first output terminal of the equalization part 111.

In the first offset control part 112, the switch 1122 is turned on when the offset signal FOB is "0". Accordingly, a current provided by the current source 1121 flows through a resistor 1111 in the equalization part 111, and thus the DC voltage of the equalization signal EQOB increases. The resistor 1111 is coupled between the first output terminal of the equalization part 111 and a ground voltage terminal.

Since, when the offset signal FOB is "1", the switch 1122 is turned off, the DC voltage of the equalization signal EQOB is not affected by the current that the current source 1121 provides.

The second offset control part 113 includes a current source 1131 and a switch 1132 that are coupled in series between the power supply terminal VDD and the second output terminal of the equalization part 111. The equalization signal EQO is output through the equalization part 111.

In the second offset control part 113, the switch 1132 is turned on when the offset signal FO is "0". Accordingly, a current provided by the current source 1131 flows through a resistor 1112 in the equalization part 111, and the DC voltage of the equalization signal EQO increases. The resistor 1112 is coupled between the second output terminal of the equalization part 111 and the ground voltage terminal.

Since the switch 1132 is turned off when the offset signal FO is "1", the DC voltage of the equalization signal EQO is not affected by the current provided by the current source 1131.

Although various embodiments have been described for illustrative purposes, it will be apparent to those skilled in the art that various changes and modifications may be made without departing from the spirit and scope of the invention as defined in the following claims.

What is claimed is:

1. A receiver comprising:
    a signal receiving part suitable for providing an output signal corresponding to a receiving signal that is received through an input terminal, a DC voltage of the output signal being controlled according to an offset signal;
    an amplifying part suitable for amplifying the output signal of the signal receiving part and outputting an amplified signal; and
    a feedback control part suitable for providing the offset signal according to the amplified signal of the amplifying part,
    wherein when the receiving signal is received by the signal receiving part, the feedback control part controls the offset signal so that a duty ratio of the amplified signal of the amplifying part decreases when the amplified signal of the amplifying part has a first level, and controls the offset signal so that the duty ratio of the amplified signal of the amplifying part increases when the amplified signal of the amplifying part has a second level.

2. The receiver of claim 1, wherein the feedback control part provides the offset signal having a constant value when the receiving signal is not received by the signal receiving part.

3. The receiver of claim 2, wherein the feedback control part provides the offset signal having a predetermined level in an initialization operation.

4. The receiver of claim 3, wherein the feedback control part controls the offset signal in correspondence to an initialization signal that is input to the signal receiving part in the initialization operation.

5. A receiver comprising:
    a signal receiving part suitable for providing an output signal corresponding to a receiving signal that is received through an input terminal, a DC voltage of the output signal being controlled according to an offset signal;
    an amplifying part suitable for amplifying the output signal of the signal receiving part and outputting an amplified signal; and
    a feedback control part suitable for providing the offset signal according to the amplified signal of the amplifying part,
    wherein the signal receiving part comprises:
    an equalization part suitable for equalizing the receiving signal and providing the output signal; and
    an offset control part suitable for controlling the DC voltage of the output signal of the equalization part according to the offset signal.

6. The receiver of claim 5,
    wherein the receiving signal is a differential signal including a first receiving signal and a second receiving signal, and the output signal of the equalization part is a differential signal including a first equalization signal and a second equalization signal, and wherein the offset control part includes a first offset control part that controls a DC voltage of the second equalization signal according to the offset signal, and a second offset control part that controls a DC voltage of the first equalization signal according to the offset signal.

7. The receiver of claim 6, wherein the offset control part performs an offset control operation such that the DC voltage of the second equalization signal increases when the offset signal has a first level, and the DC voltage of the first equalization signal increases when the offset signal has a second level.

8. The receiver of claim 7,
wherein the amplifying part differentially amplifies the first equalization signal and the second equalization signal, and outputs the amplified signal, which is a differential signal including a first output signal and a second output signal, and
wherein the feedback control part performs a control operation such that the offset signal has the second level when the first output signal has a first level and the offset signal has the first level when the first output signal has a second level.

9. The receiver of claim 8, wherein a duty ratio of an output signal of the amplifying part is smaller than 50% when the offset signal has the first level, and the duty ratio of the output signal of the amplifying part is larger than 50% when the offset signal has the second level.

10. The receiver of claim 5, wherein the equalization part comprises a continuous time linear equalizer.

11. The receiver of claim 6, wherein the first offset control part comprises:
a current source; and
a switch coupled between the current source and a first output terminal of the equalization part, the second equalization signal being output through the first output terminal of the equalization part, the switch being controlled by the offset signal and providing a current from the current source to the first output terminal of the equalization part.

12. The receiver of claim 6, wherein the second offset control part comprises:
a current source; and
a switch coupled between the current source and a second output terminal of the equalization part, the first equalization signal being output through the second output terminal of the equalization part, the switch being controlled by the offset signal and providing a current from the current source to the second output terminal of the equalization part.

13. The receiver of claim 5, wherein the feedback control part provides the offset signal having a constant value when the receiving signal is not received by the signal receiving part.

14. The receiver of claim 13, wherein the feedback control part provides the offset signal having a predetermined level in an initialization operation.

15. The receiver of claim 14, wherein the feedback control part controls the offset signal in correspondence to an initialization signal that is input to the signal receiving part in the initialization operation.

16. The receiver of claim 5, wherein when the receiving signal is received by the signal receiving part, the feedback control part controls the offset signal so that a duty ratio of the amplified signal of the amplifying part decreases when the amplified signal of the amplifying part has a first level, and controls the offset signal so that the duty ratio of the amplified signal of the amplifying part increases when the amplified signal of the amplifying part has a second level.

* * * * *